(12) United States Patent
Takahashi

(10) Patent No.: US 6,798,007 B2
(45) Date of Patent: Sep. 28, 2004

(54) METHOD OF FABRICATING A SEMICONDUCTOR DEVICE HAVING A NON-VOLATILE SEMICONDUCTOR MEMORY AND A CAPACITOR

(75) Inventor: Koji Takahashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/164,421

(22) Filed: Jun. 10, 2002

(65) Prior Publication Data

US 2002/0149046 A1 Oct. 17, 2002

Related U.S. Application Data

(62) Division of application No. 09/524,388, filed on Mar. 13, 2000, now Pat. No. 6,423,997.

(30) Foreign Application Priority Data

Mar. 12, 1999 (JP) .............................. 11-067390

(51) Int. Cl.[7] .................. H01L 27/106; H01L 29/76; H01L 29/94; H01L 31/119
(52) U.S. Cl. ..................... 257/298; 257/314; 257/315
(58) Field of Search ................. 438/253, 257, 438/258, 593; 257/298, 311, 314, 315, 316, 325

(56) References Cited

U.S. PATENT DOCUMENTS

| | | | |
|---|---|---|---|
| 5,420,449 A | | 5/1995 | Oji ............................. 257/307 |
| 5,908,311 A | * | 6/1999 | Chi et al. ................... 438/258 |
| 6,180,539 B1 | * | 1/2001 | Tung ......................... 438/770 |

FOREIGN PATENT DOCUMENTS

JP          9-321232          12/1997

* cited by examiner

*Primary Examiner*—Long Pham
*Assistant Examiner*—Hoai Pham
(74) *Attorney, Agent, or Firm*—Westerman, Hattori, Daniels & Adrian LLP

(57) ABSTRACT

A semiconductor integrated circuit comprises a non-volatile semiconductor memory and a capacitor formed respectively on a first region and a second region of a substrate, wherein an insulation film of the non-volatile semiconductor memory has a thickness different from a capacitor insulation film of the capacitor.

3 Claims, 17 Drawing Sheets

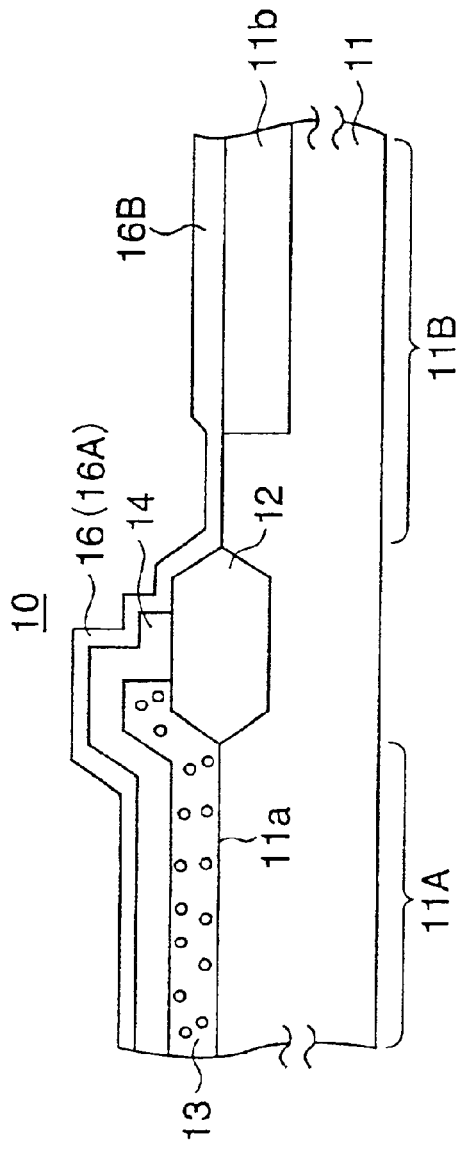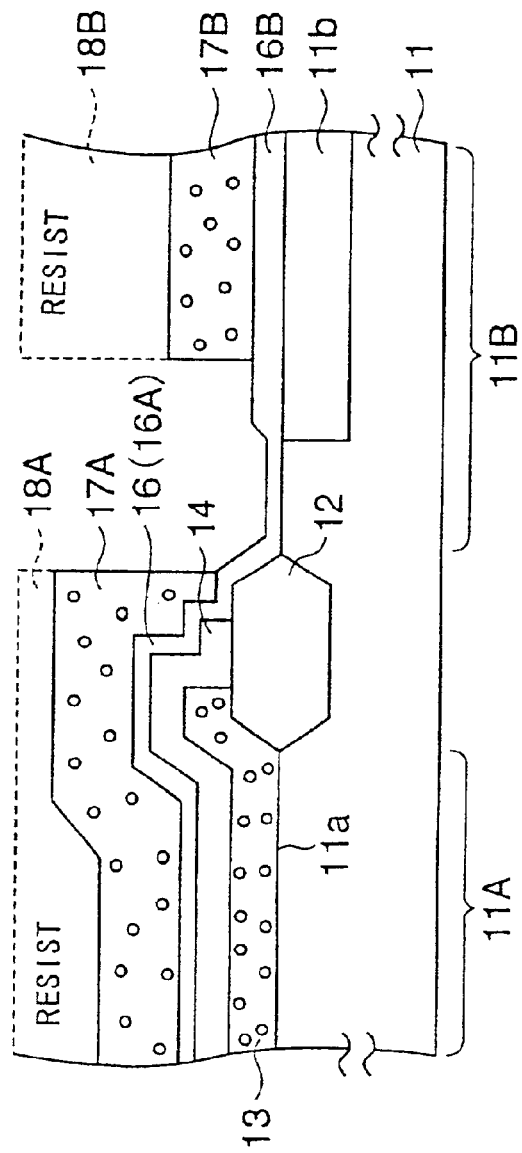
FIG.1C RELATED ART
FIG.1D RELATED ART

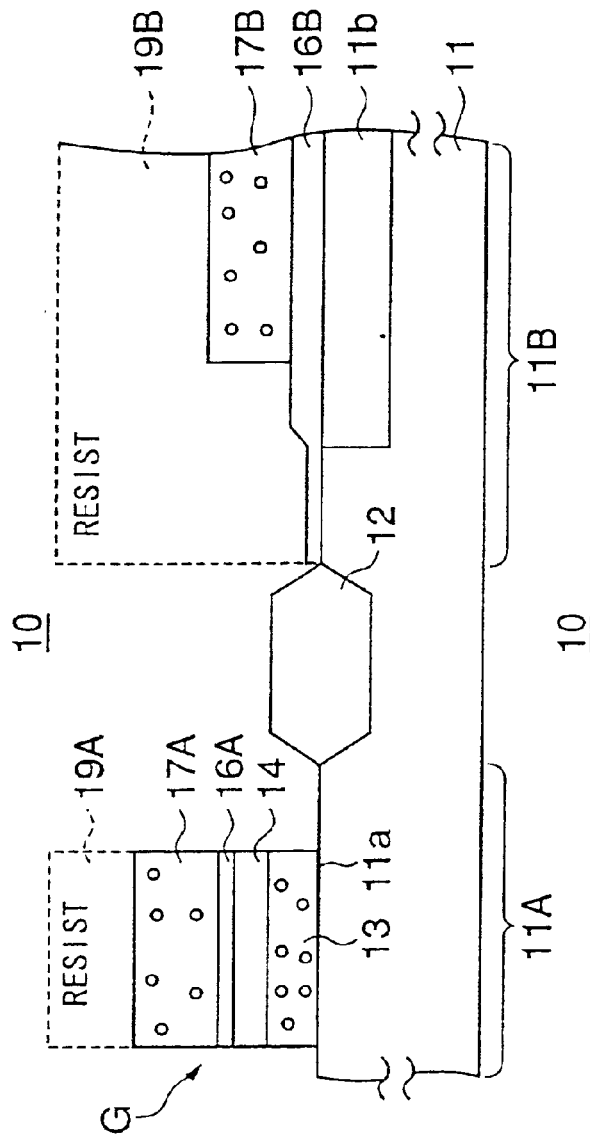
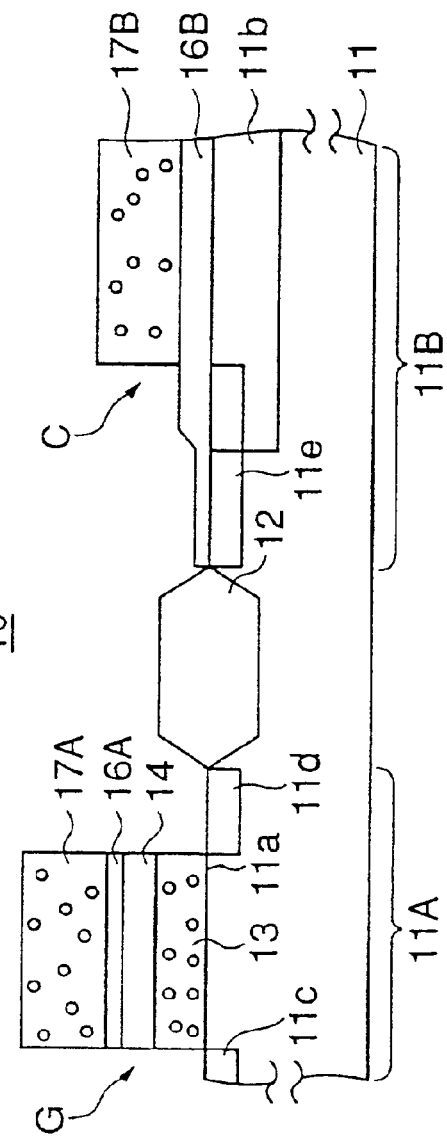
FIG.1E RELATED ART
FIG.1F RELATED ART

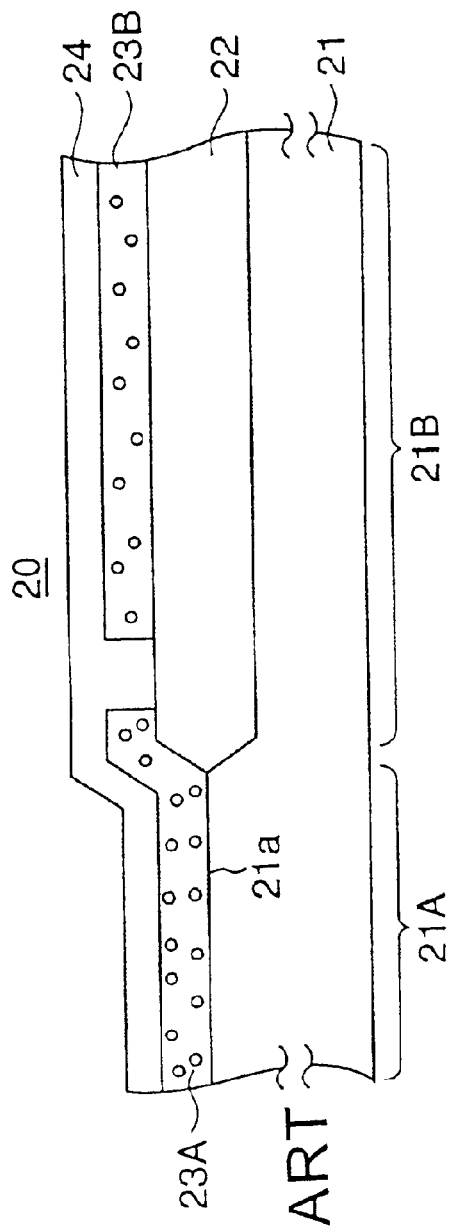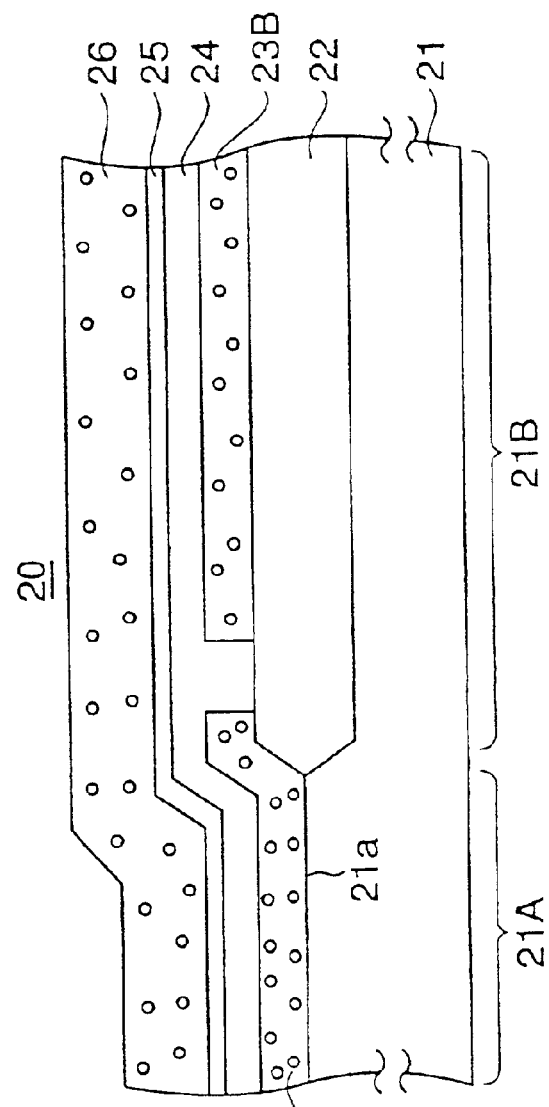
FIG.2A RELATED ART
FIG.2B RELATED ART

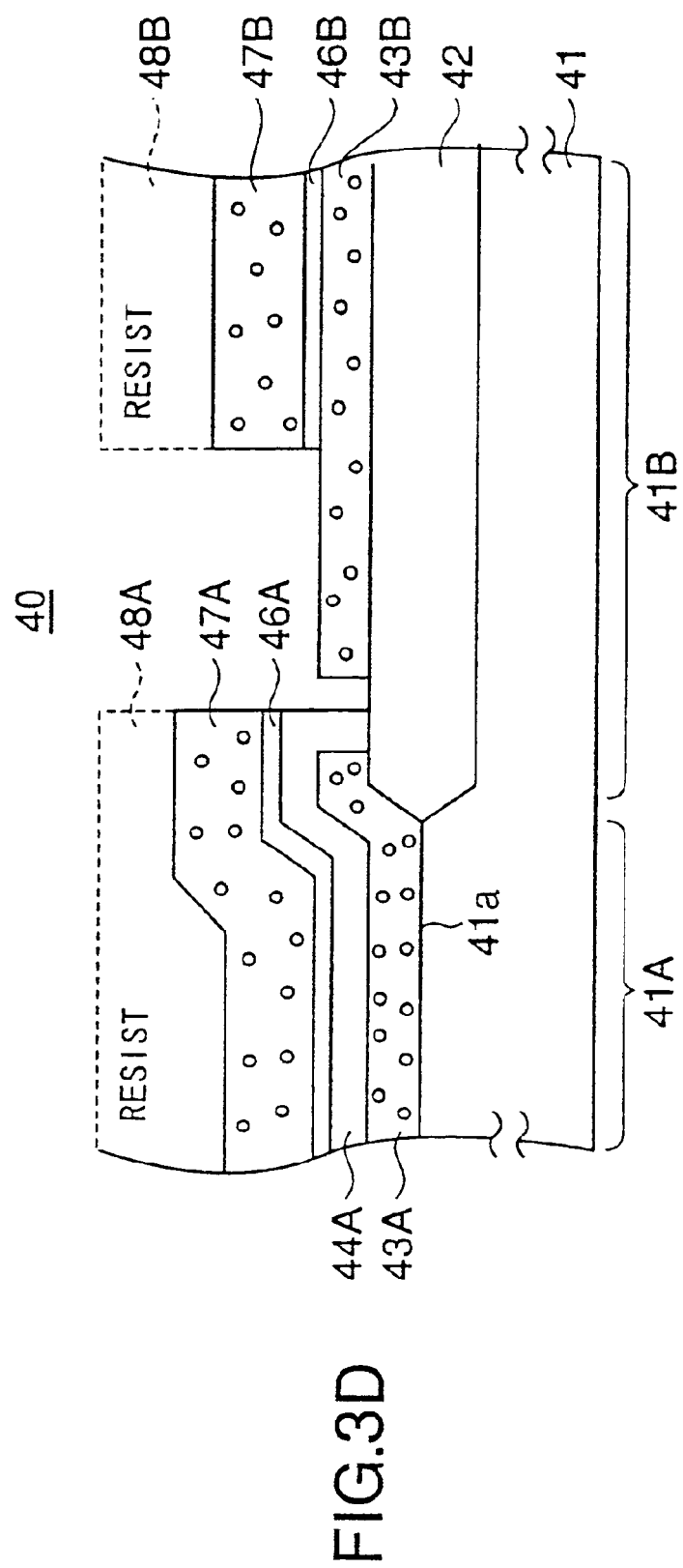

METHOD OF FABRICATING A SEMICONDUCTOR DEVICE HAVING A NON-VOLATILE SEMICONDUCTOR MEMORY AND A CAPACITOR

This application is a divisional of prior application Ser. No. 09/524,388 filed Mar. 13, 2000, now U.S. Pat. No. 6,423,997.

CROSS-REFERENCE TO RELATED APPLICATION

The present application is based on Japanese priority application No.11-067390 filed on Mar. 12, 1999, the entire contents of which are hereby incorporated by reference.

BACKGROUND OF THE INVENTION

The present invention generally relates to semiconductor devices and more particularly to a semiconductor integrated circuit in which a capacitor and a floating-capacitor are integrated on a common substrate.

Semiconductor memory devices are used extensively in various information processing apparatuses and controllers including computers together with logic operation devices such as a microprocessor. Particularly, there is a type of semiconductor memory device called non-volatile semiconductor memory device in which information is stored in a floating gate in the form of electric charges. Typical examples of the non-volatile semiconductor memory device includes EPROMs and flash memory devices. In such a non-volatile semiconductor memory devices, the information is maintained even when the electric power is turned off.

In these days, there is a demand for a so-called mixed integrated circuit in which a flash memory device is integrated with an analog device on a common semiconductor substrate. As it is usual that an analog device includes a capacitor, there is a demand for a technology to form an ordinary capacitor of the analog device and the floating capacitor of the flash memory simultaneously on a common semiconductor substrate.

FIGS. 1A–1F show the fabrication process of a mixed integrated circuit 10 according to a related art in which a flash memory device and an analog capacitor are integrated.

Referring to FIG. 1A, a p-type Si substrate 11 is formed with a field oxide film 12 such that the field oxide film 12 defines a flash memory region 11A and an analog circuit region 11B on the Si substrate 11. In correspondence to analog circuit region 11B, there is formed an n$^+$-type diffusion region 11b in the Si substrate 11 by conducting an ion implantation process of As$^+$ with a dose of $1 \times 10^{15} - 10^{16}$ cm$^{-2}$ while using an acceleration voltage of 50–500 keV. The n$^+$-type diffusion region 11b thus formed serves for a lower electrode of the analog capacitor to be formed.

In the step of FIG. 1A, a tunneling oxide film 11a is formed further on the Si substrate 11 in correspondence to the flash-memory region 11A as a result of thermal oxidation process of the Si substrate 11.

In the step of FIG. 1A, it should further be noted that a polysilicon film is deposited on the Si substrate 11 by a CVD process so as to cover the tunneling oxide film 11a with a thickness of typically 100–150 nm, and a floating gate electrode 13 of the flash-memory device is formed on the flash-memory region 11A as a result of the patterning of the polysilicon film thus formed. Further, an insulation film 14 having an ONO structure, in which an SiN film is vertically sandwiched by a pair of SiO$_2$ films, is formed on the semiconductor structure thus formed with a thickness of 20–30 nm.

Next, in the step of FIG. 1B, a resist pattern 15 is formed on the structure of FIG. 1A and the insulation film 14 is subjected to a dry etching process while using the resist pattern 15 as a mask. As a result of the dry etching process, the insulation film 14 is left only on the flash-memory region 11A as the interlayer insulation film of the flash memory device.

After the foregoing process, the resist pattern 15 is removed and a thermal oxidation process is conducted in the step of FIG. 1C. As a result of the thermal oxidation process, there is formed a gate oxide film 16 on the Si substrate 11. Further, such a thermal oxidation process induces an oxidation in the SiN film constituting the ONO structure, and there is formed a thin oxide film 16A on the insulation layer 14.

As represented in FIG. 1C, the oxidation process is accelerated in the analog circuit region 11B in correspondence to the n$^+$-type diffusion region 11b doped with As, and the thickness of the gate oxide film 16 is increased for a part represented by a reference numeral 16B. The region 16B of the thermal oxide film 16 is used for the capacitor insulation film of the capacitor to be formed.

Next, in the step of FIG. 1D, a composite conductive film of a polysilicon layer and a WSi layer is deposited on the structure of FIG. 1C, and an upper electrode 17B of the analog capacitor is formed on the analog circuit region 11B as a result of the patterning of the conductive film thus formed while using resist patterns 18A and 18B as a mask. The upper electrode 17B thus formed covers the region 16B of the thermal oxide film 16. It should be noted that a control gate electrode 17A is formed simultaneously in the flash-memory region as a result of the foregoing patterning of the conductive film.

Next, in the step of FIG. 1E, a resist pattern 19B is formed on the structure of FIG. 1D so as to cover the analog circuit region 11B, and a resist pattern 19A is formed in the flash-memory region 11A such that the resist pattern 19A covers a part of the control gate electrode 17A. By conducting a dry etching process through the control electrode 17A, the thermal oxide film 16A, the ONO film 14 and the floating gate 13 consecutively while using the resist patterns 19A and 19B as a mask, a gate electrode structure G is formed as represented in FIG. 1E.

Finally, the resist patterns 19A and 19B are removed and an ion implantation process of As$^+$ or P$^+$ is conducted under an acceleration voltage of typically 50–80 keV and a dose of $1 \times 10^{15} - 10^{16}$ cm$^{-2}$ while using the control gate electrode 17A and the upper electrode 17B as a mask. As a result of the ion implantation process, there are formed n-type diffusion regions 11c and 11d in the Si substrate at both lateral sides of the gate electrode structure G. Further, there is formed another diffusion region 11e in the analog circuit region 11B as a result of the foregoing ion implantation process, such that the diffusion region 11e extends from the diffusion region 11b to the field oxide film 12.

In the structure of FIG. 1F, it can be seen that a flash-memory cell having the gate electrode structure G is formed in the flash-memory region 11A defined on the Si substrate 11 and that an analog capacitor C having the diffusion region 11b as the lower electrode, the oxide film 16B as the capacitor insulation film and the polysilicon electrode 17B as the upper electrode, is formed on the same Si substrate 11 in correspondence to the analog circuit region 11B. Thereby, the flash-memory cell and the analog capacitor C are formed substantially simultaneously.

Thus, the foregoing process of the related art enables the formation of a flash memory device and an analog capacitor substantially on the same Si substrate. On the other hand, the capacitor thus formed has a drawback in that the analog circuit cooperating with the analog capacitor is vulnerable to electrical noise propagating through the substrate or change of the substrate bias voltage. As can be seen in FIG. 1F, the lower electrode 11b of the capacitor C is formed in the Si substrate in the form of a diffusion region.

Further, the mixed integrated circuit of the prior art formed according to the process of FIGS. 1A–1F suffers from the problem of increased thickness of the capacitor insulation film 16B, which is caused in the step of FIG. 1C for oxidizing the Si substrate 11 for forming the gate oxide film 16. As noted previously, there occurs an acceleration of oxidation in the diffusion region 11b doped to the $n^+$-type.

It should be noted that the foregoing problem of accelerated oxidation appears conspicuously when conducting the oxidation process at a low temperature by using a wet oxidation technique so as to form the gate oxide film 16 with a uniform thickness. There can be a case in which the thickness of the capacitor insulation film 16B reaches 100 nm when the oxidation process is conducted so as to form the gate oxide film to have a thickness of only 5–10 nm. As a result of the increased thickness of the capacitor insulation film, the analog capacitor thus formed tends to have a reduced capacitance as compared with the designed capacitance value. This means that it is necessary to increase the capacitor area for compensating the decrease of the capacitance caused by the increased thickness of the capacitor insulation film.

In order to avoid the problem of electrical noise in the substrate, there is a proposal to form the analog capacitor on an insulating structure such as the field oxide film 12 formed on the Si substrate 11.

FIGS. 2A–2E show the fabrication process of a semiconductor integrated circuit 20 according to a related art in which the analog capacitor is formed on a field oxide film.

Referring to FIG. 2A, a p-type Si substrate 21 is formed with a field oxide film 22 such that the field oxide film 22 defines a flash memory region 21A. The filed oxide film 22 on the other hand defines an analog circuit region 21B. In the step of FIG. 2A, a tunneling oxide film 21a is formed on the Si substrate 21 in correspondence to the flash-memory region 21A as a result of a thermal oxidation process of the Si substrate 21.

Next, in the step of FIG. 2A, a polysilicon film is deposited on the Si substrate 21 by a CVD process so as to cover the tunneling oxide film 21a with a thickness of typically 100–150 nm. By patterning the polysilicon film thus deposited, there is formed a floating gate electrode 23A of the flash-memory device on the foregoing flash-memory region 21A. Simultaneously, there is formed a polysilicon pattern 23B on the field oxide film 22 as the lower electrode 11b of the analog capacitor. In the step of FIG. 2A, an insulation film 24 having an ONO structure is formed on the structure thus obtained such that the insulation film 24 covers the polysilicon patterns 23A and 23B with a thickness of 20–30 nm.

Next, in the step of FIG. 2B, a thermal oxidation process is conducted on the structure of FIG. 2A and a gate oxide film is formed on the Si substrate 21. Associated with such a formation of the gate oxide film, there is formed a thin oxide film 25 on the insulation film 24 as a result of oxidation of the SiN film constituting the ONO structure. Thereby, it should be noted that the problem of accelerated oxidation in the analog circuit region 21B as in the case of the step of FIG. 1C is effectively avoided due to the fact that the oxide film 25 is formed on the ONO insulation film 24 that extends continuously from the flash-memory region 21A to the analog circuit region 21B. In the step of FIG. 2B, a conductive film 26 is formed further on the oxide film 25 by a CVD process of a polysilicon film and a WSi film such that the conductive film 26 has a total thickness of 300–400 nm.

Next, in the step of FIG. 2C, the conductive film 26 and the underlying oxide film 25 and further the ONO film 24 underneath the oxide film 25 are patterned while using resist patterns 28A and 28B as a mask, and there are formed a capacitor insulation film and an upper electrode pattern 26B of the analog capacitor to be formed on the analog circuit region 21B, wherein the capacitor insulation film is formed of the ONO pattern 24B and the oxide pattern 25B thereon.

At the same time, there is formed a conductor pattern 26A in the flash memory region 21A as a result of the patterning of the conductive film 26. Further, an oxide pattern 25A is formed in the region 21A as a result of the patterning of the oxide film 25 and an ONO pattern 24A is formed as a result of the patterning of the ONO film 24.

Next, in the step of FIG. 2D, a resist pattern 29B is formed on the structure of FIG. 5C such that the resist pattern 29B covers the analog circuit region 21B, and a resist pattern 29A is formed on the control gate electrode 26A in the flash-memory region 21A. Further, the control electrode 26A, the oxide pattern 25A, the ONO pattern 24A and the floating gate pattern 23A underneath are patterned consecutively by a dry etching process while using the resist patterns 29A and 29B as a mask, to form a gate electrode structure G.

Finally, in the step of FIG. 2E, the resist films 29A and 29B are removed, and an ion implantation process of $As^+$ or $P^+$ is conducted under an acceleration voltage of 50–80 keV with a dose of $1 \times 10^{15}$–$10^{16}$ cm$^{-2}$. As a result of the ion implantation process, there are formed n-type diffusion regions 21c and 21d in the Si substrate 21 at both lateral sides of the gate structure G.

In the structure of FIG. 2E, it will be noted that there are formed a flash memory cell and an analog capacitor C respectively on the flash-memory region 21A and on the analog circuit region 31B, wherein the flash memory cell has the gate electrode structure G while the analog capacitor is formed of the lower electrode of the polysilicon pattern 23B on the field oxide film 22, the capacitor insulation film formed of the ONO pattern 24B and the oxide pattern 25B thereon, and the upper electrode of the polysilicon pattern 26B. The flash memory cell and the analog capacitor are formed simultaneously. As the capacitor C is formed on the field oxide film 22, the analog circuit cooperating with the capacitor C is immune to noise or bias voltage change in the substrate 21.

In the semiconductor integrated circuit 20 of FIG. 2E, on the other hand, it should be noted that the capacitor insulation film includes not only the oxide pattern 25B but also the ONO pattern 24B, and thus, the capacitance of the capacitor C becomes inevitably small in the foregoing construction of the related art. In view of the fact that a thickness of 20–30 nm is needed for the ONO pattern 24A for stable operation of the flash-memory, the ONO pattern 24B also has a thickness of 20–30 nm. In a flash-memory, in which a high voltage is applied to the control electrode 26A, it should be noted that a sufficient film thickness is needed for the ONO pattern 24A.

SUMMARY OF THE INVENTION

Accordingly, it is a general object of the present invention to provide a novel and useful semiconductor device wherein the foregoing problems are eliminated.

Another and more specific object of the present invention is to provide a semiconductor integrated circuit device including a semiconductor device and a capacitor formed on a common semiconductor substrate, wherein the effect of noise in the semiconductor substrate on the capacitor is eliminated and the capacitance of the capacitor is maximized simultaneously.

Another object of the present invention is to provide a semiconductor integrated circuit comprising:

a substrate defined with a first region and a second region;

a non-volatile semiconductor memory formed on said first region of said substrate;

a capacitor formed on said second region of said substrate;

said non-volatile semiconductor memory including a floating gate electrode formed on said first region, an insulation film formed on said floating gate electrode and a control electrode formed on said insulation film, said capacitor including a lower electrode formed on said second region of said substrate, a capacitor insulation film formed on said lower electrode, and an upper electrode formed on said capacitor insulation film, wherein said insulation film and said capacitor insulation film having respective, mutually different thicknesses.

According to the present invention, it is possible to form the insulation film of the non-volatile memory to have a large thickness and capacitor insulation film of the analog capacitor to have a reduced thickness. Thereby, the flash memory can endure application of a high voltage, while the analog capacitor can provide a large capacitance. In the event a high voltage is applied to the analog capacitor, it is also possible to form the capacitor insulation film with a thickness exceeding the thickness of the insulation film of the non-volatile semiconductor memory.

In another aspect, the present invention enables formation of a semiconductor integrated circuit having a flash-memory device and a capacitor on a common substrate substantially simultaneously, such that the capacitor insulation film has a thickness different from the thickness of an insulation film in the flash-memory device. It should be noted that such a change of thickness between the insulation film and the capacitor insulation film can be caused by changing the impurity concentration level between the floating electrode, on which the insulation film is to be formed, and the lower electrode. By forming the analog capacitor such that the analog capacitor is insulated from the substrate, the effect of noise in the semiconductor substrate on the operation of the analog circuit that uses the analog capacitor is minimized.

Another object of the present invention is to provide a method of fabricating a semiconductor device, comprising the steps of:

defining first and second regions on a substrate;

forming a tunneling insulation film on said first region of said substrate;

forming a device isolation film on said second region of said substrate;

forming a first electrode pattern and a second electrode pattern on said substrate substantially simultaneously such that said first electrode pattern covers said tunneling insulation film and such that said second electrode pattern covers said second electrode pattern;

forming a first insulation pattern by forming a first insulation film so as to cover said first electrode pattern and said second electrode pattern and by patterning said first insulation pattern such that said second electrode pattern is exposed;

forming, after said step of forming said first insulation pattern, a second insulation pattern on said second electrode pattern by oxidizing a surface of said exposed second electrode pattern;

depositing, after said step of forming said second insulation pattern, a conductive film on said substrate such that said conductive film covers said first electrode pattern carrying thereon said first insulation pattern and further said second electrode pattern carrying said second insulation pattern; and patterning said conductive film to form third and fourth electrodes respectively on said first insulation pattern and said second insulation pattern simultaneously.

According to the semiconductor fabrication process of the present invention, it is possible to form the semiconductor integrated circuit such that the insulation film in the non-volatile semiconductor memory has an increased thickness over the capacitor insulation film of the capacitor.

Further, the present invention enables formation of the insulation film and the capacitor insulation film by an oxidation process conducted such that the rate of oxidation is different between the case of forming the insulation film and the case of forming the capacitor insulation film. Thus, it is possible to increase the thickness of the insulation film of the non-volatile semiconductor memory device, which is subjected to application of a high voltage, over the capacitor insulation film, which is required to have a small thickness as possible for increasing the capacitance. Such a change of the oxidation rate is easily achieved by conducting the step of introducing the impurity element by an ion implantation process of $P^+$.

Other objects and further features of the present invention will become apparent from the following detailed description when read in conjunction with the attached drawings.

BRIEF DESCRIPTION OF THE DRAWINGS

FIGS. 1A–1F are diagrams showing the fabrication process of a semiconductor integrated circuit according to a related art;

FIGS. 2A–2E are diagrams showing the fabrication process of a semiconductor integrated circuit according to another related art;

FIGS. 3A–3F are diagrams showing the fabrication process of a semiconductor integrated circuit according to a first embodiment of the present invention;

DETAILED DESCRIPTION OF THE INVENTION

First Embodiment

FIGS. 3A–3F show the fabrication process of a semiconductor integrated circuit 40 according to a first embodiment of the present invention.

Figure 1A:
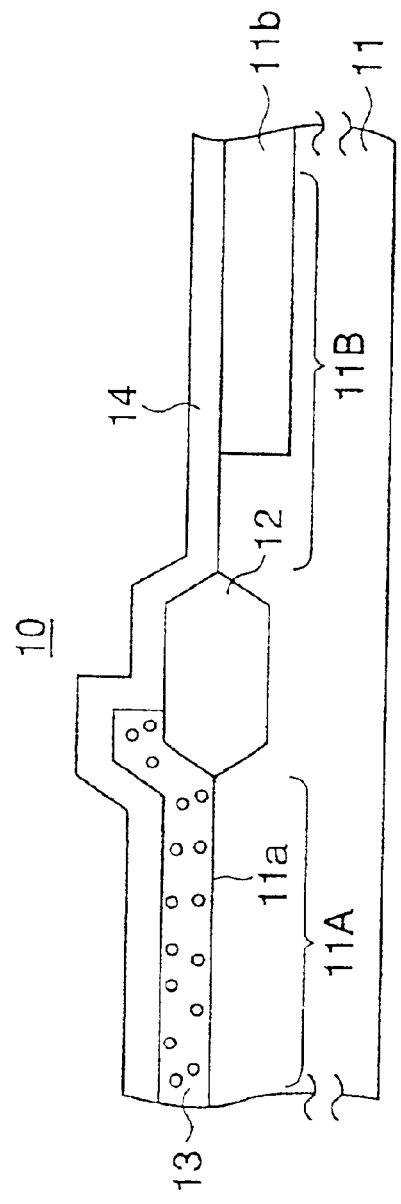
Figure 1B:
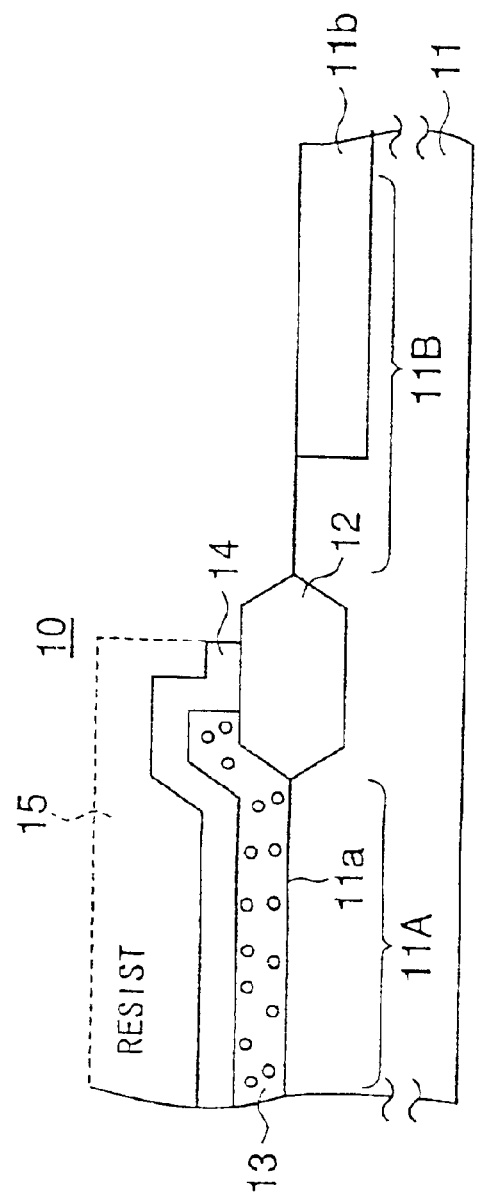
Figure 2C:
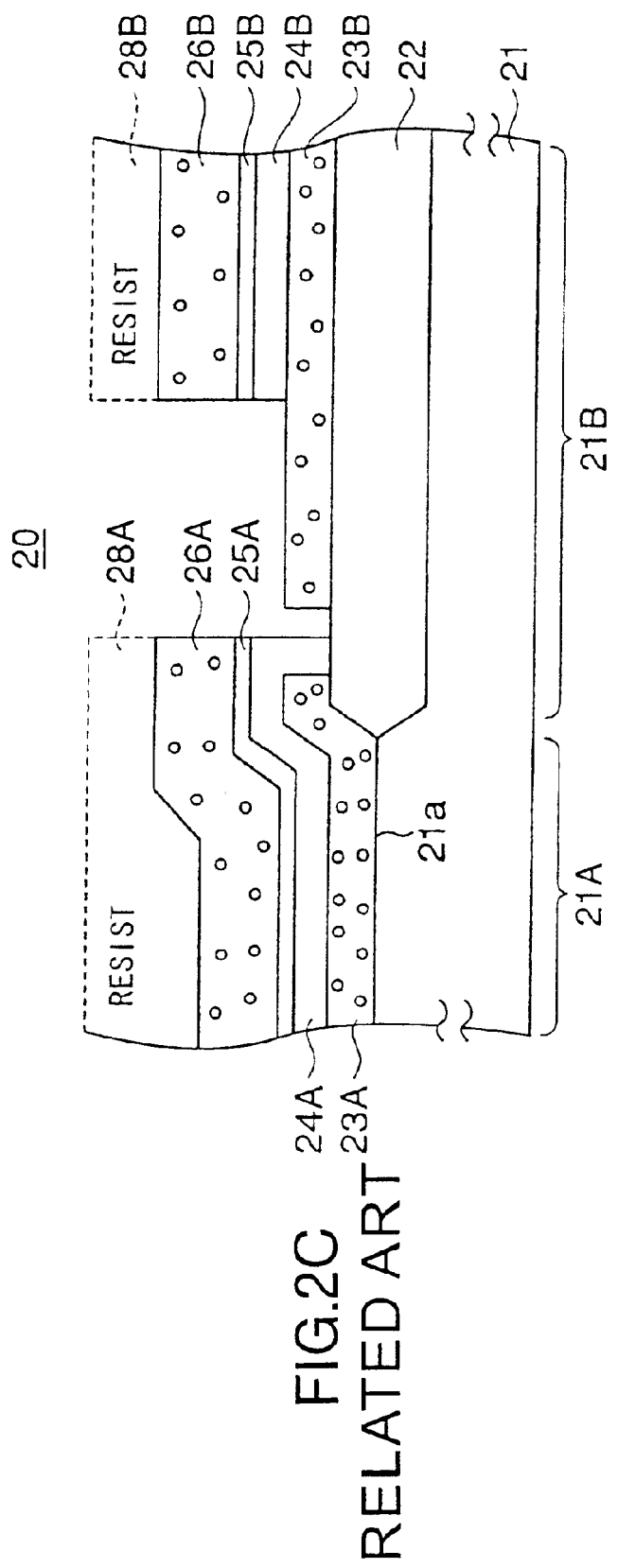
Figure 2D:
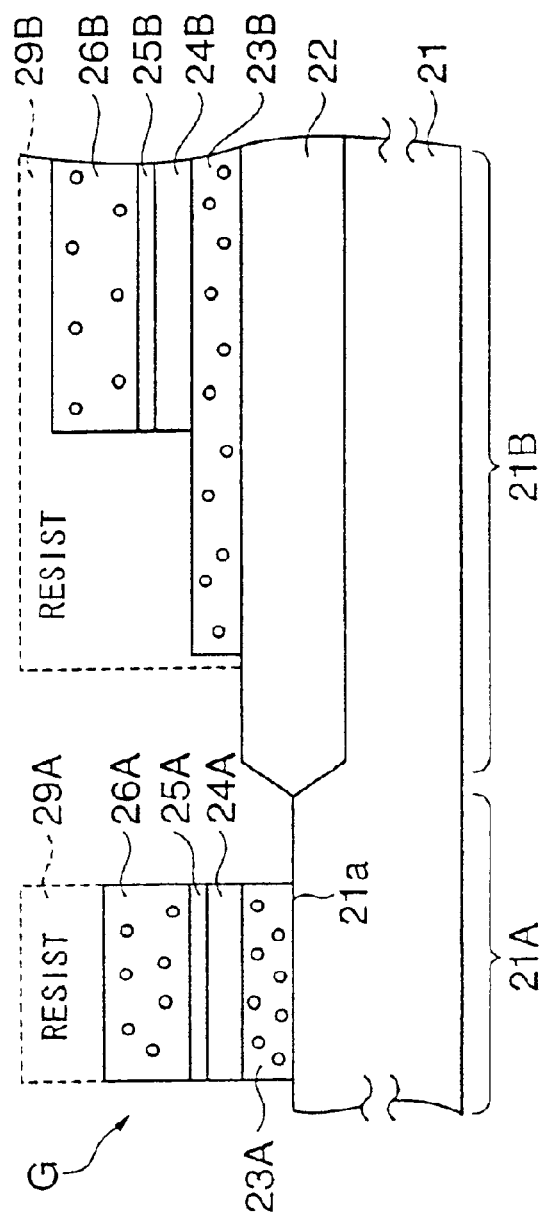
Figure 2E:
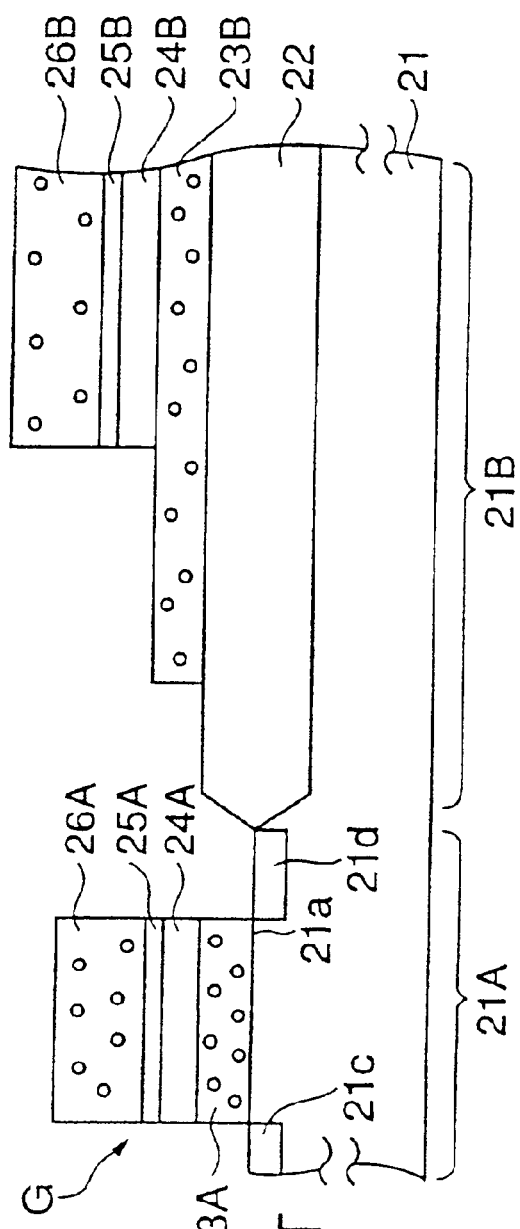
Figure 3A:
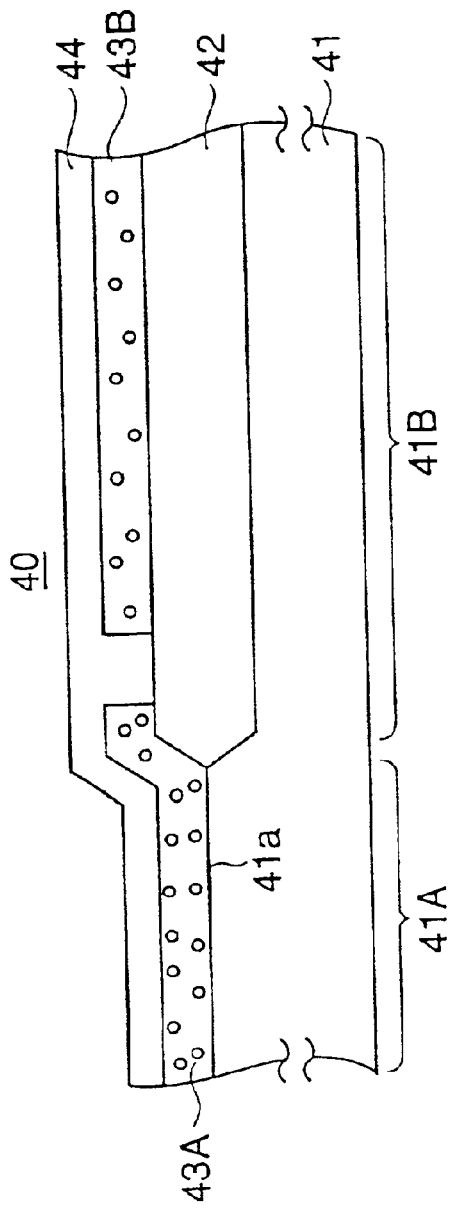

Referring to FIG. 3A, a field oxide film 42 is formed on a p-type Si substrate 41 such that the field oxide film 42 exposes a part of the Si substrate 41 defining a flash-memory region 41A 41. The field oxide film 42 itself provides an analog circuit region 41B. In the step of FIG. 3A, a tunneling oxide film 41a is formed on the Si substrate 41 in correspondence to the flash-memory region 41A as a result of a thermal oxidation process of the Si substrate 41.

In the step of FIG. 3A, a polysilicon film is further deposited on the Si substrate 41 by a CVD process with a thickness of 100–150 nm so as to cover the tunneling oxide film 41a, and a floating gate electrode 43A of the flash-memory device is formed on the flash-memory region 41A as a result of the patterning of the foregoing polysilicon film. Simultaneously, a polysilicon electrode pattern 43B constituting the lower electrode of the analog capacitor C is formed on the field oxide film 42.

In the step of FIG. 3A, an insulation film 44 having an ONO structure is formed on the structure thus obtained with a thickness of 20–30 nm. As noted previously, the ONO structure includes an SiN film sandwiched by a pair of $SiO_2$ films. More specifically, the ONO film 44 is formed by depositing an $SiO_2$ film and an SiN film consecutively by a CVD process with respective thicknesses of several nanometers, followed by a thermal oxidation process of the SiN film.

Figure 3B:
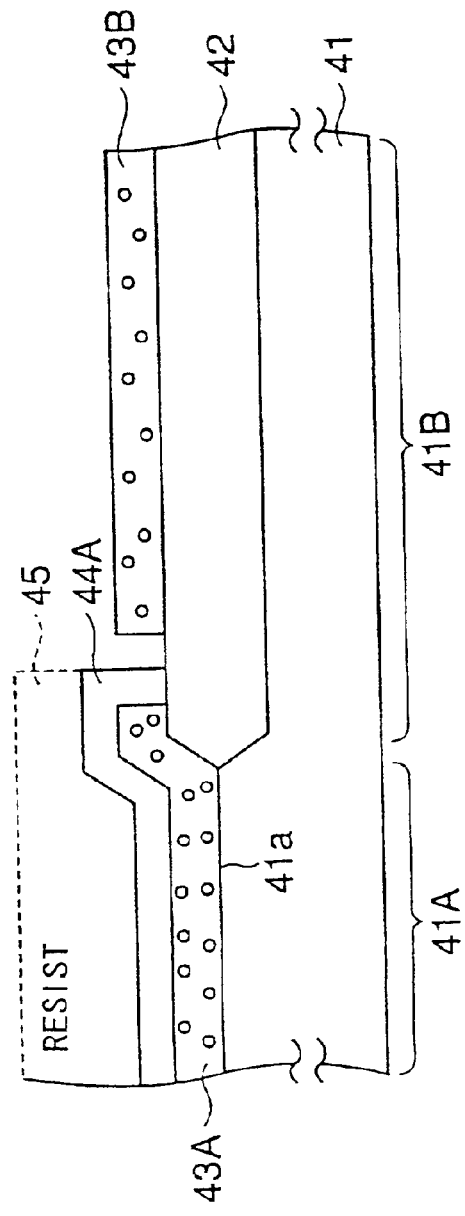

Next, in the step of FIG. 3B, a resist pattern 45 covering the flash-memory region 41A is formed on the structure of FIG. 3A, followed by a dry etching process of the insulation film 44 while using the resist pattern 45 as a mask, to form an interlayer insulation film pattern 44A in the flash-memory region such that the insulation film pattern 44A covers the floating gate electrode 43A. With the formation of the interlayer insulation film 44A, it should be noted that the lower electrode 43B is exposed on the field oxide film 42.

Figure 3C:
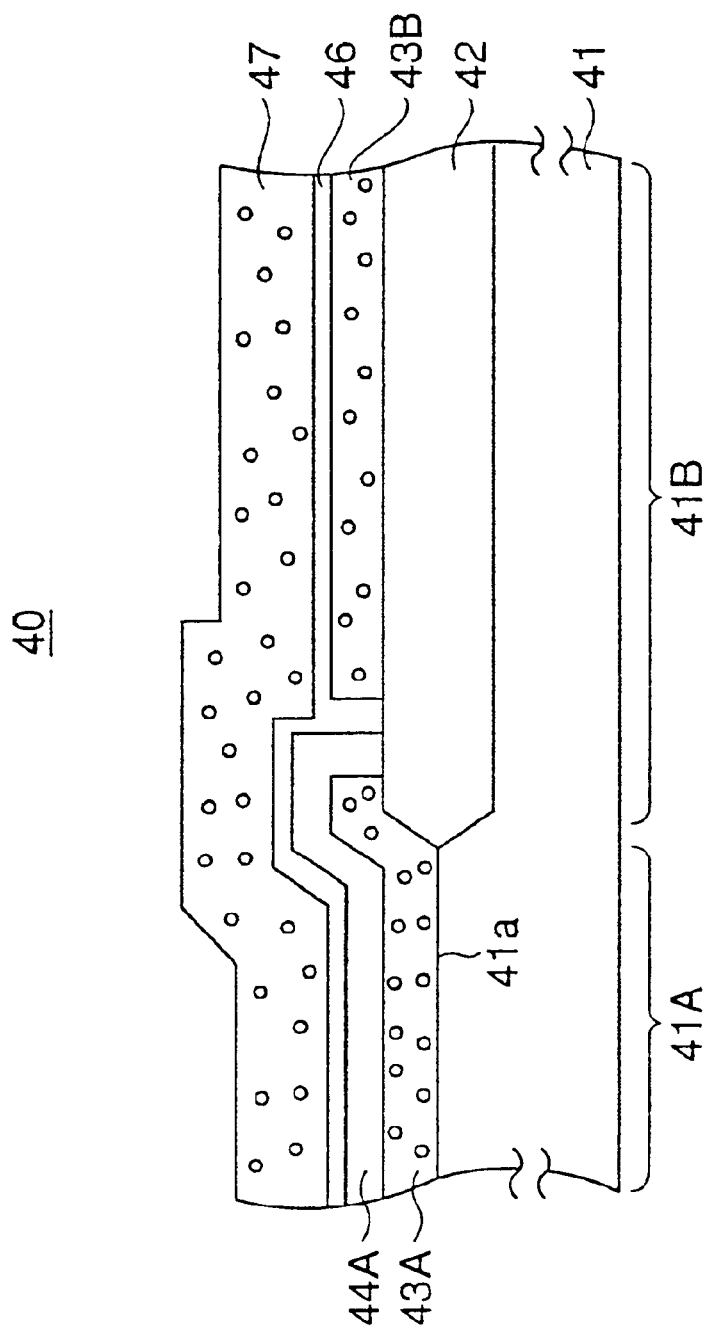

Next, in the step of FIG. 3C, the resist pattern 45 is removed and an oxide film 46 is formed by a thermal oxidation process or by a CVD process with a thickness of typically 5–10 nm, such that the oxide film 46 covers the interlayer insulation film pattern 44A and the lower electrode 43B. Further, a conductive film 47 is formed on the oxide film 46 with a thickness of typically 300–400 nm by stacking a polysilicon layer and a WSi layer by a CVD process consecutively, and the step of FIG. 3D is conducted in the step of FIG. 3D in which the conductive film 47 and the underlying oxide film 46 are patterned while using resist patterns 48A and 48B as a mask. As a result of the patterning, an oxide pattern 46B is formed from the insulation film 46. Further, a conductor pattern 47B is formed from the conductive layer 47. It should be noted that the oxide pattern 46B and the conductor pattern 47B form respectively a capacitor insulation film and an upper electrode of the analog capacitor C. Simultaneously to the foregoing patterning process of FIG. 3D, there are formed a conductive pattern 47A in the flash-memory region 41 as a result of the patterning of the conductive film 47. Further, an oxide pattern 46A is formed on the ONO pattern 44A as a result of the patterning of the oxide film 46. It should be noted that the conductive pattern 47A constitutes the control gate electrode of the flash-memory device.

Figure 3E:
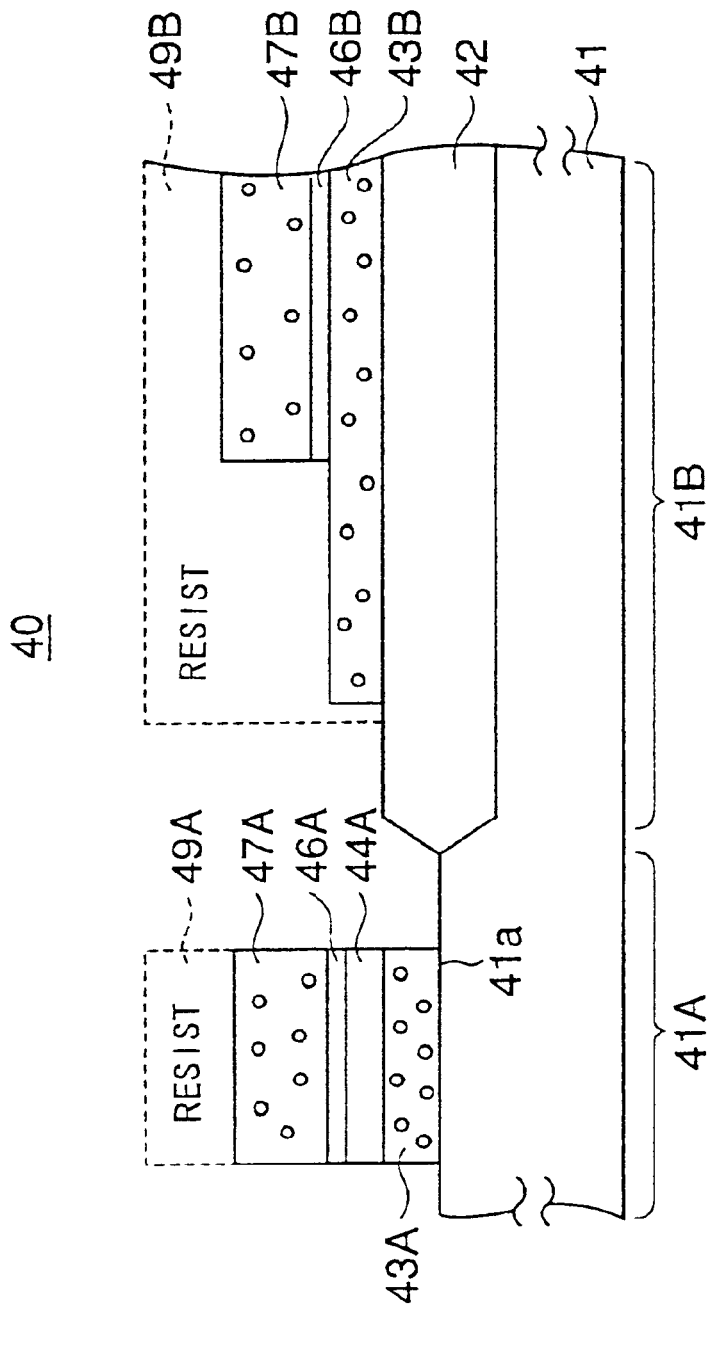

Further, in the step of FIG. 3E, there is formed a resist pattern 49B covering the analog circuit region 41B, and a resist pattern 49A is formed in the flash-memory region 41A such that the resist pattern 49A covers the control electrode 47A. The control electrode 47A, the oxide pattern 46A, the ONO pattern 44A and further the floating gate pattern 43A underneath are then patterned consecutively while using the resist patterns 49A and 49B as a mask, and the gate structure G is formed as a result.

Figure 3F:
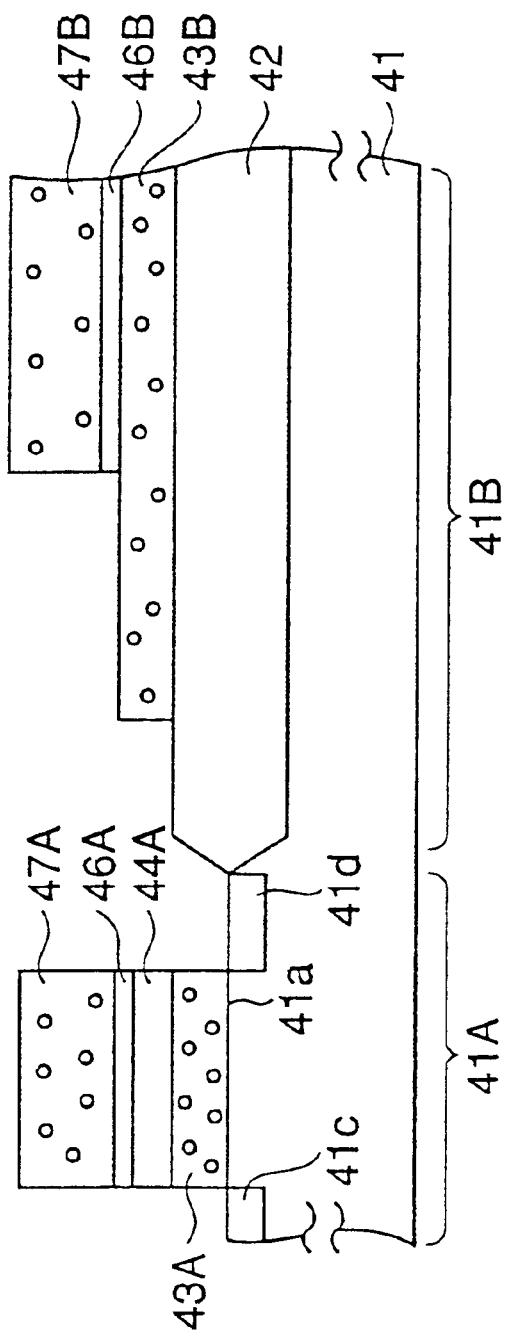

Finally, in the step of FIG. 3F, the resist patterns 49A and 49B are removed, and an ion implantation of $As^+$ or $P^+$ is conducted into the Si substrate 41 under an acceleration voltage of 50–80 keV and a dose of $1 \times 10^{15}$–$1 \times 10^{16}$ cm$^{-2}$, while using the control electrode 47A as a mask. As a result, n-type diffusion regions 41c and 41d are formed in the Si substrate 41 at both lateral sides of the gate electrode structure G.

In the structure of FIG. 3F, it can be seen that a flash memory cell having the gate electrode structure G is formed on the flash-memory region 41A defined on the Si substrate 41. Further, there is formed an analog capacitor C on the field oxide film 42 in correspondence to the analog circuit region 41B of the Si substrate 41, wherein the analog capacitor C thus formed includes the polysilicon pattern 43B as the lower electrode, the oxide pattern 46B as the capacitor insulation film, and the polysilicon pattern 47B as the upper electrode. The flash memory device and the analog capacitor C are formed substantially simultaneously.

In the semiconductor integrated circuit having such a construction, the analog circuit cooperating with the capacitor C is substantially immune to the fluctuation of the bias voltage or noise in the substrate 41, as the lower electrode 43B of the capacitor C is formed on the field insulation film 42. Further, the semiconductor integrated circuit of the present embodiment provides an advantageous feature of large capacitance due to the reduced thickness of the capacitor insulation film. In the present embodiment, it should be noted that the capacitor insulation film is formed of the oxide film 46B alone, wherein the oxide film 46B has a thickness of 5–10 nm. On the other hand, the gate electrode structure G in the flash-memory region 41A includes the thick insulation film 44A in addition to the thin oxide pattern 46A. Thus, the flash memory device can successfully avoid the problem of breakdown of the insulation film even in such a case a high voltage is applied to the control electrode 47A. As the insulation pattern 44A and the capacitor insulation film 46B have respective, mutually different compositions, the overall dielectric constant of the insulation pattern 44A and the oxide pattern 46A takes a value different from the dielectric constant of the capacitor insulation film 46B.

Second Embodiment

FIGS. 4A–4F show the fabrication process of a semiconductor integrated circuit 50 according to a second embodiment of the present invention.

Figure 4A:
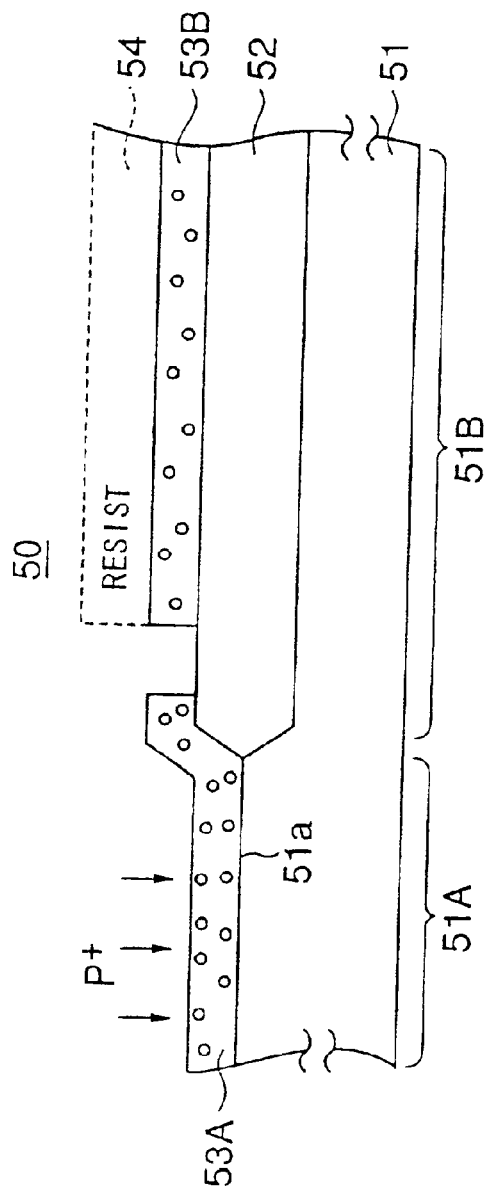
FIGS. 4A–4F are diagrams showing the fabrication process of a semiconductor integrated circuit according to a second embodiment of the present invention.

Referring to FIG. 4A, a field oxide film 52 is formed on a p-type Si substrate 51 so as to define a flash-memory region 51A on the Si substrate 51. The field oxide film 52 itself provides an analog circuit region 51B. In the step of FIG. 4A, a tunneling oxide film 51a is formed on the Si substrate 51 in correspondence to the flash-memory region 51A as a result of thermal oxidation process of the Si substrate 51.

In the step of FIG. 4A, it should further be noted that a polysilicon film is deposited on the Si substrate 51 by a CVD process with a thickness of typically 100–150 nm such that the polysilicon film covers the tunneling insulation film 51a. By patterning the polysilicon film thus formed, a floating electrode 53A of the flash-memory device is formed on the flash-memory region 51A. Simultaneously, a polysilicon electrode pattern 53B is formed on the field oxide film 52 in correspondence to the lower electrode of the analog capacitor C.

In the step of FIG. 4A, the lower electrode pattern 53B is protected by a resist pattern and an ion implantation process of $P^+$ is conducted into the floating gate electrode 53A under an acceleration voltage of 40–60 keV with a dose of typically $1 \times 10^{14}$–$10^{16}$ cm$^{-2}$. As a result, the floating gate electrode has a low resistivity in the order of 200–300 Ω/□.

Figure 4B:
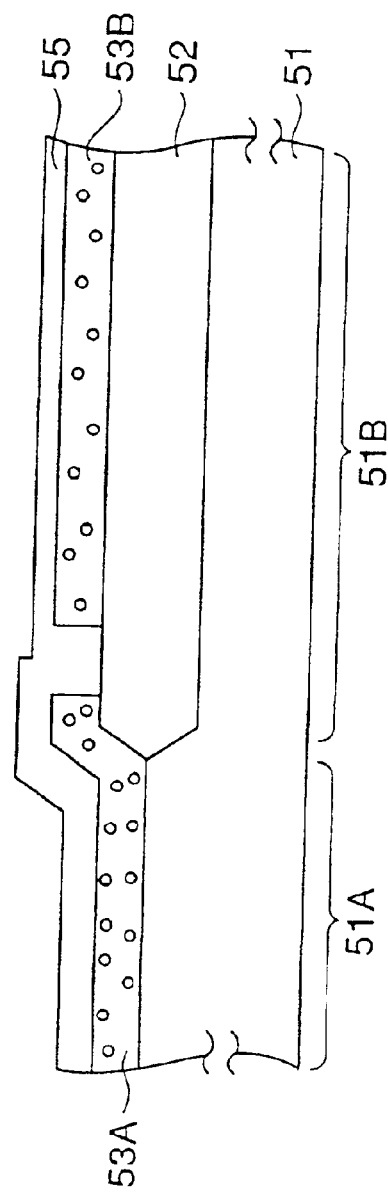

Next, the step of FIG. 4B is conducted in which the resist pattern 54 is removed and an insulation film 55 having an ONO structure is formed by a thermal oxidation process and a CVD process with a thickness of typically 20–30 nm, such that the insulation film 55 covers the floating gate electrode 53A and the lower electrode 53B. During this process, there occurs an accelerated oxidation in the floating gate electrode 53A, which has been introduced with $P^+$ in the ion implantation process, and the insulation film 55 has a thickness of 30–40 nm on the floating gate electrode 53A, which is substantially larger than the thickness of 20–30 nm. It should be noted that no such an accelerated oxidation process occurs on the lower electrode 53B in which no such an ion implantation process has been made.

Figure 4C:
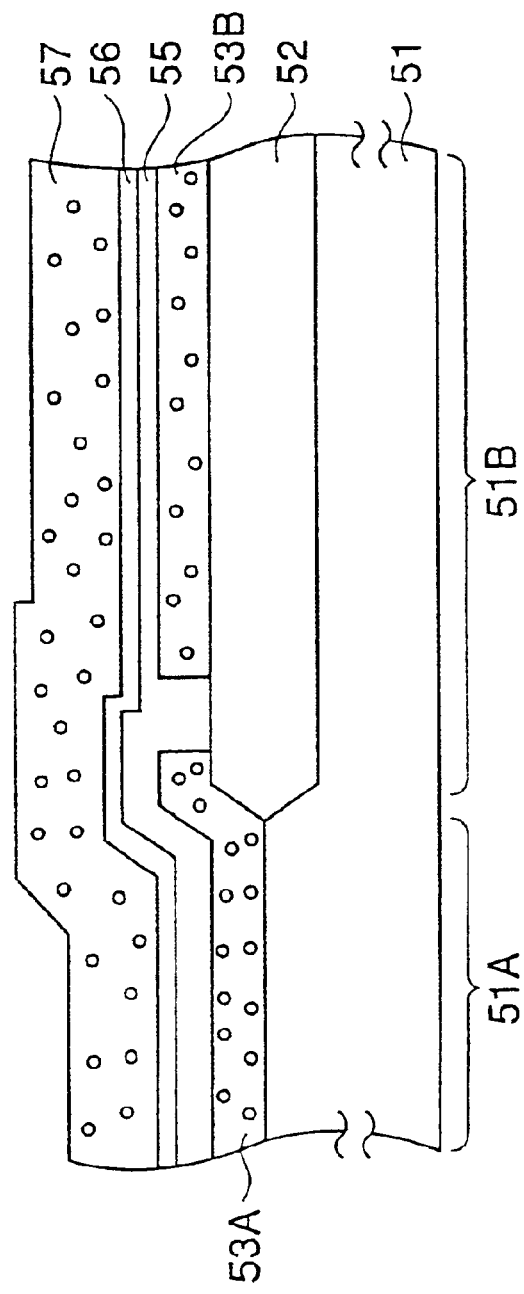

Next, in the step of FIG. 4C, a thermal oxidation process is applied to the structure of FIG. 4B and an oxide film 56 is formed typically with a thickness of 5–10 nm such that the oxide film 56 covers the ONO insulation film 55. The process of forming the oxide film 56 corresponds to the process of forming a gate oxide film of other MOS transistors. Further, a conductive film 57 is formed on the oxide film 56 with a thickness of 300–400 nm by depositing a polysilicon film and a WSi film consecutively by a CVD process.

Figure 4D:
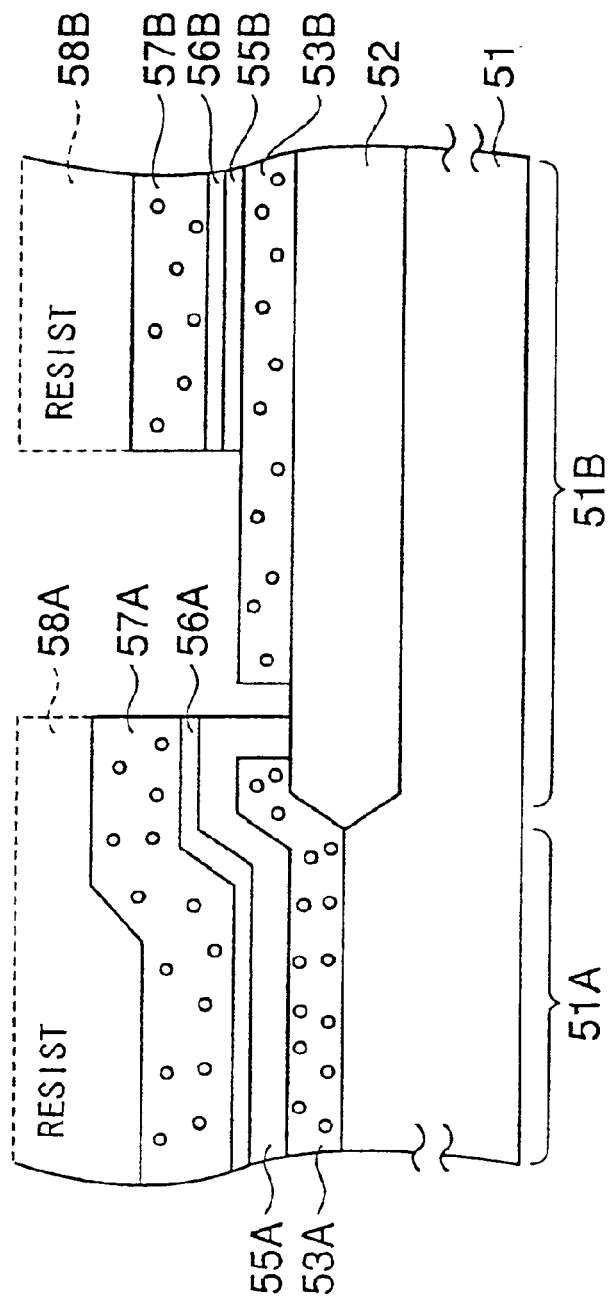

Next, in the step of FIG. 4D, the conductive film 57, the oxide film 56 and the ONO insulation film 56 are patterned while using resist patterns 58A and 58B as a mask, to form an ONO insulation pattern 55B and an oxide pattern 56B on the analog circuit region 51B as a capacitor insulation film of the analog capacitor C to be formed. Further, an electrode pattern 57B is formed as the upper electrode of the analog capacitor C. Simultaneously, there are formed a conductive pattern 57A and an oxide pattern 56A in the flash-memory region 51A as a result of the patterning of the conductive film 57, wherein the oxide pattern 56A is formed on an ONO pattern 55A, which is also formed as a result of the patterning of the ONO layer 55A.

Figure 4E:
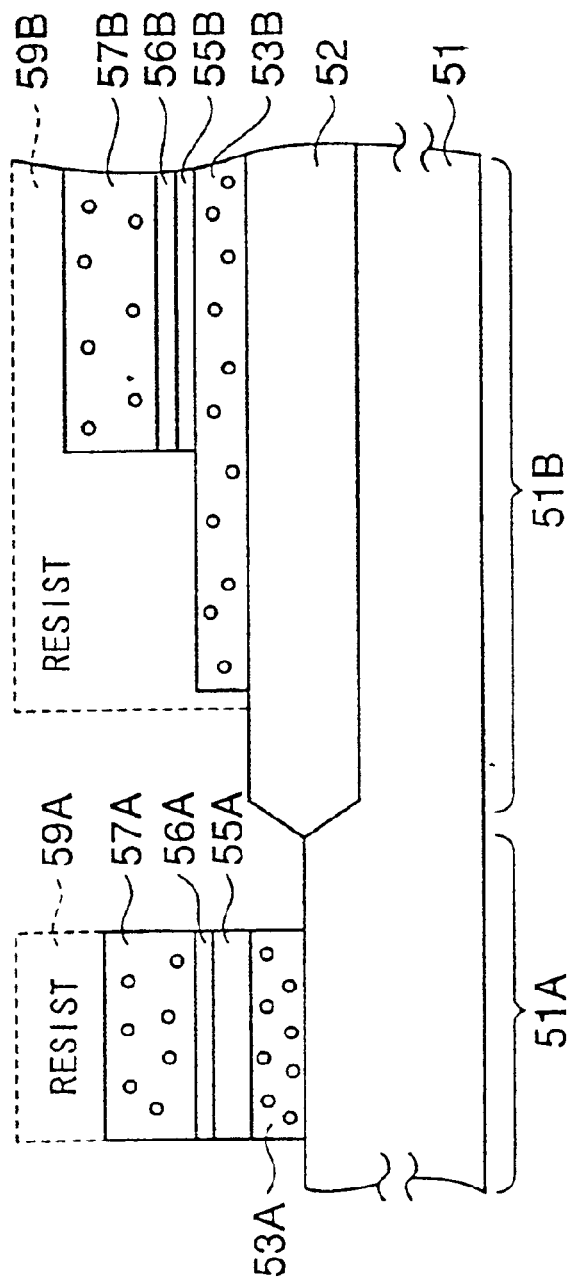

Next, in the step of FIG. 4E, a resist pattern 59B is formed on the structure of FIG. 4D such that the resist pattern 59B covers the analog circuit region 51B, and a resist pattern 59A is formed on the control electrode 57A in the flash-memory region 51A. Further, the control electrode 57A, the oxide pattern 56A, the insulation pattern 55A and the floating electrode pattern 53A are subjected to a dry etching process while using the resist patterns 59A and 59B as a mask. As a result of the dry etching process, there is formed a gate electrode structure G.

Figure 4F:
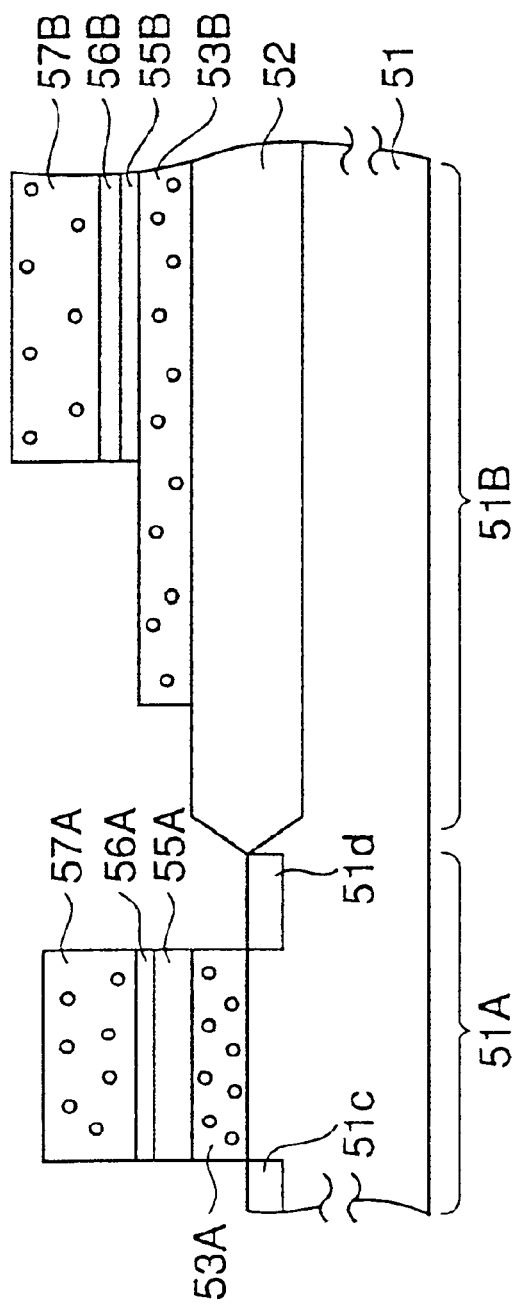

Finally, in the step of FIG. 4F, the resist patterns 59A and 59B are removed and an ion implantation process of $As^+$ or $P^+$ is conducted into the Si substrate under an acceleration voltage of 50–80 keV with a dose of $1\times10^{15}$–$10^{16}$ cm$^{-2}$, while using the control electrode 57A as a mask, to form n-type diffusion regions 51c and 51d in the Si substrate 51 at both lateral sides of the gate electrode structure G.

In the structure of FIG. 4F, it should be noted that a flash-memory device having the gate electrode structure G is formed in the flash-memory region 51A simultaneously to the analog capacitor C formed on the field oxide region 52 in the analog circuit region 51B. As noted previously, the capacitor C includes the polysilicon pattern 53B formed on the field oxide film 52 as the lower electrode, the insulation pattern 55B and the oxide pattern 56B as the capacitor insulation film, and the polysilicon pattern 57B as the upper electrode.

As the lower electrode 57B of the capacitor C is formed on the field oxide film 52, the analog circuit cooperating with the capacitor C is immune to the noise in the substrate 51 or the fluctuation of the bias voltage. Further, in view of the fact that the capacitor insulation film 55B has a thickness smaller than the thickness of the insulation pattern 55A in the gate electrode structure G, the capacitor C provides a large capacitance. The gate structure G of the flash-memory device, on the other hand, has a suitable structure for application of a high voltage in view of the fact that the thin oxide pattern 56A and the thick insulation pattern 55A form together an insulation film having a large thickness.

In the present embodiment, the oxidation process of the polysilicon pattern 53A is selectively enhanced in the insulation deposition process of FIG. 4B as a result of ion implantation process of $P^+$ into the polysilicon pattern 53A in the step of FIG. 4A. In capacitor C, on the other hand, no such an ion implantation process is conducted. Thus, there occurs no increase of the capacitor insulation film 55B.

In the event a large voltage exceeding the voltage applied to the gate structure G is to be applied to the capacitor C, on the other hand, an ion implantation process of $P^+$ may be conducted into the polysilicon electrode pattern 53B in the step of FIG. 4A with a dose exceeding the dose of the floating electrode pattern 53A. By doing so, the thickness of the insulation film 55 is increased in the part locating above the lower electrode pattern 53B over the part locating on the floating electrode 53A.

In the step of FIG. 4A, it should be noted that $O^+$ or $N^+$ may be also used in the ion implantation process of FIG. 4A in place of $P^+$.

Further, the present invention is not limited to the embodiments described heretofore, but various variations and modifications may be made without departing from the scope of the invention.

What is claimed is:

1. A method of fabricating a semiconductor device, comprising the steps of:

defining first and second regions on a substrate;

forming a tunneling insulation film on said first region of said substrate;

forming a device isolation film on said second region of said substrate;

forming a first electrode pattern and a second electrode pattern on said substrate substantially simultaneously such that said first electrode pattern covers said tunneling insolation film and such that said second electrode pattern covers said device isolation film;

forming a first insulation pattern by forming a first insulation film so as to cover said first electrode pattern and said second electrode pattern and by patterning said first insulation pattern such that said second electrode pattern is exposed;

forming, after said step of forming said first insulation pattern, a second insulation pattern on said second electrode pattern by oxidizing a surface of said exposed second electrode pattern;

depositing, after said step of forming said second insulation pattern, a conductive film on said substrate such that said conductive film covers said first electrode pattern carrying thereon said first insulation pattern and further said second electrode pattern carrying said second insulation pattern; and patterning said conductive film to form third and fourth electrodes respectively on said first insulation pattern and said second insulation pattern simultaneously.

2. A method of fabricating a semiconductor integrated circuit including a non-volatile semiconductor memory and a capacitor, comprising the steps of:

forming a tunneling insulation film on a first region of a substrate;

forming a device isolation film on a second region of said substrate;

forming a first electrode pattern and a second electrode pattern respectively on said first region and said second region substantially simultaneously, such that said first electrode pattern covers said tunneling insulation film;

introducing an impurity element into one of said first and second electrode patterns selectively by an ion implantation process;

oxidizing a surface of said first electrode pattern and a surface of said second electrode pattern, to form a first insulation pattern having a first thickness and a second insulation pattern having a second thickness respectively on said first and second electrode patterns;

depositing, after said step of forming said first and second insulation patterns, a conductive film so as to cover said first electrode pattern carrying thereon said first insulation pattern and said second electrode pattern carrying thereon said second insulation pattern; and patterning said conductive film to form a third electrode pattern and a fourth electrode pattern substantially simultaneously, such that said third electrode pattern covers said first insulation pattern and such that said fourth electrode pattern covers said second insulation pattern.

3. A method as claim in claim 2, wherein said step of introducing said impurity element includes a step of introducing $P^+$ into said first electrode pattern by an ion implantation process.

* * * * *